United States Patent
Wu et al.

(10) Patent No.: US 10,962,582 B2
(45) Date of Patent: Mar. 30, 2021

(54) GROUND POSITION OF THE GROUND FAULT METHOD FOR POWER DISTRIBUTION NETWORK, SYSTEM, AND STORAGE MEDIUM

(71) Applicants: BEIJING GUODIAN TONG NETWORK TECHNOLOGY CO., LTD, Beijing (CN); STATE GRID JIBEI ELECTRIC POWER CO., LTD, Beijing (CN); STATE GRID QINHUANGDAO POWER SUPPLY COMPANY, Hebei (CN)

(72) Inventors: Xinling Wu, Beijing (CN); Shen Liu, Beijing (CN); Tiejun Zhao, Qinhuangdao (CN); Yue Yu, Qinhuangdao (CN); Weiyue Zhou, Beijing (CN); Chuanbo Tian, Beijing (CN); Ke Qiao, Beijing (CN); Xiaoling Zhu, Beijing (CN); Yaxin Liu, Beijing (CN); Dong Liang, Beijing (CN); Aimei Yan, Beijing (CN); Shuhan Zhang, Beijing (CN); Lili Zhang, Qinhuangdao (CN); Yi Yuan, Qinhuangdao (CN); Xuemei Wu, Qinhuangdao (CN); Jian Zhu, Qinhuangdao (CN); Lingchen Sun, Qinhuangdao (CN); Sining Wang, Beijing (CN); Man Leng, Beijing (CN)

(73) Assignees: BEIJING GUODIAN TONG NETWORK TECHNOLOGY CO., LTD, Beijing (CN); STATE GRID JIBEI ELECTRIC POWER CO., LTD, Beijing (CN); STATE GRID QINHUANGDAO POWER SUPPLY COMPANY, Hebei (CN)

( * ) Notice: Subject to any disclaimer, the term of this patent is extended or adjusted under 35 U.S.C. 154(b) by 46 days.

(21) Appl. No.: 16/472,955

(22) PCT Filed: Jul. 17, 2017

(86) PCT No.: PCT/CN2017/093180
§ 371 (c)(1),
(2) Date: Jun. 24, 2019

(87) PCT Pub. No.: WO2018/120772
PCT Pub. Date: Jul. 5, 2018

(65) Prior Publication Data
US 2019/0361066 A1    Nov. 28, 2019

(30) Foreign Application Priority Data
Dec. 26, 2016    (CN) .......................... 201611217939.9

(51) Int. Cl.
*G01R 31/08* (2020.01)

(52) U.S. Cl.
CPC .................................. *G01R 31/086* (2013.01)

(58) Field of Classification Search
None
See application file for complete search history.

(56) References Cited

U.S. PATENT DOCUMENTS

| 5,428,549 A | 6/1995 | Chen |
| 5,455,776 A | 10/1995 | Novosel |

(Continued)

FOREIGN PATENT DOCUMENTS

| CN | 102508102 A | 6/2012 |
| CN | 102879711 A | 1/2013 |

(Continued)

OTHER PUBLICATIONS

International Search Report in the international application No. PCT/CN2017/093180, dated Sep. 27, 2017.

(Continued)

*Primary Examiner* — Jas A Sanghera
(74) *Attorney, Agent, or Firm* — Syncoda LLC; Feng Ma

(57) ABSTRACT

A ground fault locating method for a power distribution network includes: monitoring each phase line of three phase distribution lines, and in the event of occurrence of waves with fault features, performing wave recording to obtain phase line record files; combining the record files corresponding to each of the three phase lines to obtain fault record files; and synthesizing the fault record files to form a transient record file, determining a fault location according (Continued)

to a wave having a maximum change in wave amplitude between two points in the transient record file, and displaying the fault location in a wiring diagram. The ground fault locating method for a power distribution network can significantly improve accuracy of single-phase ground fault detection.

10 Claims, 2 Drawing Sheets

(56) References Cited

U.S. PATENT DOCUMENTS

| | | | |
|---|---|---|---|
| 2007/0008666 A1* | 1/2007 | Morita | B60L 3/0023 361/42 |
| 2018/0241200 A1* | 8/2018 | Hu | H02H 1/0007 |

FOREIGN PATENT DOCUMENTS

| | | | |
|---|---|---|---|
| CN | 202794433 U | 3/2013 | |
| CN | 103217625 A | 7/2013 | |
| CN | 103487724 A | 1/2014 | |
| CN | 104764971 A | 7/2015 | |
| CN | 105548814 A | 5/2016 | |
| CN | 205333777 U | 6/2016 | |
| CN | 105759179 A | 7/2016 | |
| CN | 106124936 A | 11/2016 | |
| CN | 106771870 A | 5/2017 | |

OTHER PUBLICATIONS

English translation of the Written Opinion of the International Search Authority in the international application No. PCT/CN2017/093180, dated Sep. 27, 2017.

Small Current Grounding Fault Location Principle Based on HTT adapted from Techniques of Automation and Application / Hou, Guoqiang Li, Silan, published on Feb. 25, 2016.

Power Distribution Network Single Phase Grounding Fault Positioning Based on Amplitude Comparison of Transient Zero-Sequence Current adapted from Electrotechnics Electric / Shuai, Junqiang Zou, Wei Zhao, Gaoshuai, published on Apr. 15, 2012.

* cited by examiner

# GROUND POSITION OF THE GROUND FAULT METHOD FOR POWER DISTRIBUTION NETWORK, SYSTEM, AND STORAGE MEDIUM

TECHNICAL FIELD

The disclosure relates to the technical field of locating a fault in a power distribution network, and particularly to a method and system for locating a ground fault in a power distribution network, and a computer storage medium.

BACKGROUND

In a power distribution network system in China, single-phase ground faults occur at a highest occurrence rate and account for about 80% of all faults. Single-phase ground faults may frequently occur in wet weather, which not only affect normal power supply to users, but also may generate over-voltages to burn out equipment and even cause inter-phase short circuits resulting in accidents. Therefore, such faults may seriously affect safety of power distribution equipment and a power distribution network. When single-phase ground faults occur, fault currents are low and fault features are indistinct and different, thus, it is quite difficult to detect and determine a single-phase ground fault. In a conventional art, a single-phase ground fault is detected mainly by the following methods.

1: A low-current fault line selection device is used. But, the low-current fault line selection device may only select a line with a ground fault and provide an indication signal, and may not locate the fault. Moreover, a fault feature of the low-current ground fault is indistinct, and it is difficult to select a line for a resonant grounding system. Thus, location accuracy of the device is not so high.

2: A signal source method is used. The principle of this method is that, when a single-phase ground fault occurs, indistinct signals generated in case of the ground fault are manually amplified and features of asymmetric current signals on a faulty line are analyzed to determine and locate the fault. In such a manner, connection of a signal source to a primary side may bring potential safety hazards to the line, and a high-resistance ground fault may not be accurately detected. Herein, the side that a power supply and input power are connected to is called the primary side.

3: A conventional single-phase ground fault indicator is used. But, the conventional single-phase ground fault indicator may not accurately extract a high-frequency transient current. Thus, inaccuracy of the high-frequency transient current makes fault determination and location accuracy low.

From the above, how to accurately detect a single-phase ground fault is a technical problem urgent to be solved by those skilled in the art at present.

SUMMARY

In view of this, embodiments of the disclosure provide a ground fault positioning method and system for a power distribution network and a computer storage medium, which may remarkably improve single-phase ground fault detection accuracy.

The solutions of the embodiments of the disclosure are implemented as follows.

The embodiments of the disclosure provide a method for locating a ground fault in a power distribution network, the method including the following operations.

Each phase line of a three-phase power distribution line is monitored, and in response to an occurrence of a fault feature waveform, wave recording is performed to obtain a wave recording file of the phase line.

The wave recording file of each phase line of the three-phase power distribution line is combined and integrated to obtain a fault wave recording file.

The fault wave recording files are synthesized into a transient wave recording file, a position of the ground fault is determined according to a waveform between two points with maximum variation amplitudes in the transient wave recording file, and the position of the ground fault is displayed in a wiring diagram.

In an embodiment, an acquisition unit configured for each phase line of the three-phase power distribution line may be used to perform wave recording on the phase line, and a time difference between a time when each acquisition unit performs wave recording on the phase line and a time when the wave recording files are combined and integrated may be smaller than a preset value. In an embodiment, the wave recording file may at least include waveforms in M periods prior to and N periods following a fault point, both of M and N being positive integers.

In an embodiment, M=3 and N=5.

The embodiments of the disclosure also provide a system for locating a ground fault in a power distribution network, the system including an acquisition module, a combining module and a processing module.

The acquisition module may be configured to monitor each phase line of a three-phase power distribution line and, in response to an occurrence of a fault feature waveform, perform wave recording to obtain a wave recording file of the phase line.

The combining module may be configured to combine and integrate the wave recording file of each phase line of the three-phase power distribution line to obtain a fault wave recording file.

The processing module may be configured to synthesize the fault wave recording files into a transient wave recording file, determine a position of the ground fault according to a waveform between two points with maximum variation amplitudes in the transient wave recording file and display the position of the ground fault in a wiring diagram.

In an embodiment, the acquisition module may include acquisition units arranged on respective phase lines of the three-phase power distribution line.

In an embodiment, the acquisition module may perform, through the acquisition units configured for respective phase lines, wave recording on the respective phase lines, and a time difference between a time when each acquisition unit performs wave recording on the phase line and a time when the wave recording files are combined and integrated may be smaller than a preset value. In an embodiment, the acquisition module may record acquired waveforms in M periods prior to and N periods following a fault point in the wave recording file, both of M and N being positive integers.

In an embodiment, M=3 and N=5.

The embodiments of the disclosure also provide a computer storage medium having stored thereon computer-executable instructions configured to execute the method for locating a ground fault in a power distribution network.

The embodiments of the disclosure provide the method for locating a ground fault in a power distribution network and the computer storage medium. The method includes that: each phase line of the three-phase power distribution line is monitored, and if the fault feature waveform appears, wave recording is performed to obtain the wave recording file of the phase line; the wave recording file of each phase line of the three-phase power distribution line is combined and integrated to obtain the fault wave recording file; and the fault wave recording files are synthesized into the transient wave recording file, the position of the ground fault is determined according to the waveform between the two points with the maximum variation amplitudes in the transient wave recording file, and the position of the ground fault is displayed in the wiring diagram.

It can be seen that, in the embodiments of the disclosure, a location process is divided into three steps of acquisition, combining and synthesis, and when a fault occurs, wave recording is performed on each phase line, the corresponding wave recording file is combined and integrated and waveforms before and after the fault in the transient wave recording file synthesized from the fault wave recording files are compared and analyzed to judge and locate the fault, so that single-phase ground fault detection accuracy is remarkably improved.

In addition, the embodiments of the disclosure also provide the system for locating a ground fault in the power distribution network, which may achieve the same technical effect and will not be elaborated herein.

BRIEF DESCRIPTION OF THE DRAWINGS

In order to describe the technical solutions in the embodiments of the disclosure or the conventional art more clearly, the drawings required to be used in descriptions about the embodiments or the conventional art will be simply introduced below. It is apparent that the drawings described below are only the embodiments of the disclosure. Other drawings may further be obtained by those of ordinary skill in the art according to the provided drawings without creative work.

DETAILED DESCRIPTION

The technical solutions in the embodiments of the disclosure will be clearly and completely described below in combination with the drawings in the embodiments of the disclosure. It is apparent that the described embodiments are not all embodiments but only part of embodiments of the disclosure. All other embodiments obtained by those of ordinary skill in the art on the basis of the embodiments in the disclosure without creative work shall fall within the scope of protection of the disclosure.

For solving the technical problem, the embodiments of the disclosure provide a ground fault positioning method, which may remarkably improve single-phase ground fault detection accuracy.

Figure 1:
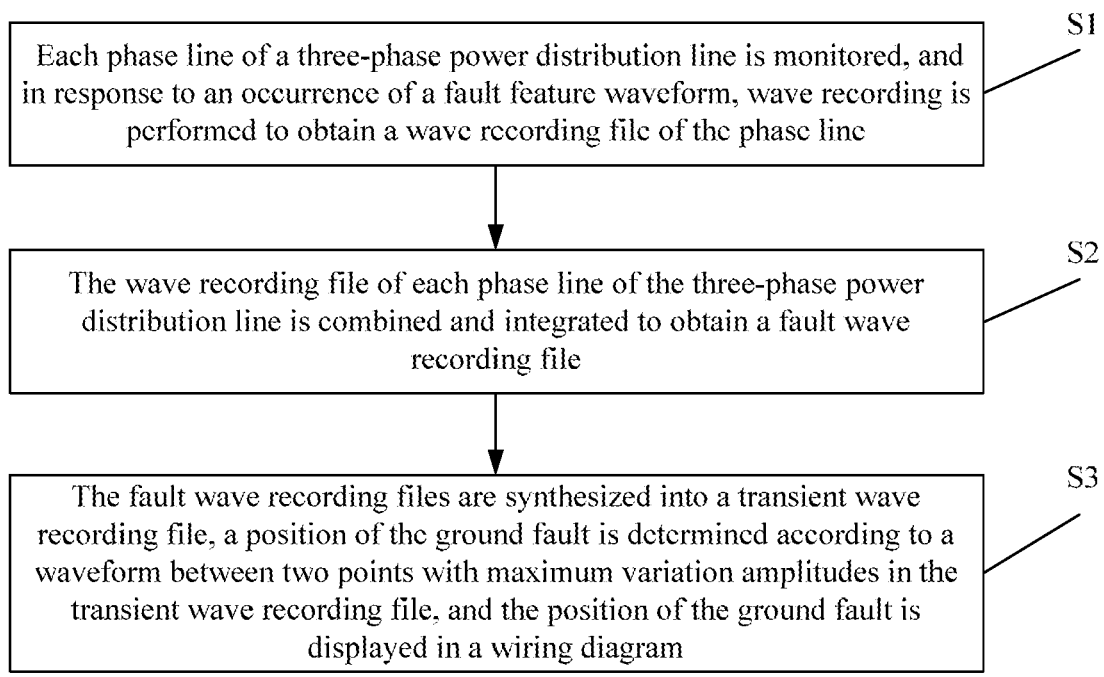
FIG. 1 is an implementation flowchart of a method for locating a ground fault in a power distribution network according to an embodiment of the disclosure.

In a specific implementation solution, referring to FIG. 1, S1-S3 are included.

In S1, each phase line of a three-phase power distribution line is monitored, and in response to an occurrence of a fault feature waveform, wave recording is performed to obtain a wave recording file of the phase line.

In the implementation solution of the disclosure, corresponding wave recording devices are mounted on the power distribution line with one mounted on each phase line through fixtures to implement real-time monitoring and wave recording of each phase line.

It is to be noted that a transient wave recording type fault indicator in S3 refers to a device hung on the power distribution line for a long time, designed maintenance-free service life is more than 5 years, and provided electricity self-taking coils are also limited, so that it is necessary to set an index capable of accurately locating a fault on the premise of considering both of power consumption and performance. After a lot of test and optimization work, a wave recording range adopted in the embodiments of the disclosure is from M full-period waves before to N full-period waves after a fault point, both of M and N being positive integers. Preferably, the wave recording range is from M=3 full-period waves before to N=5 full-period waves after the fault point, and there are 80 sampling points for each full-period wave. Of course, another wave recording range and sampling points may be selected. Selecting a larger wave recording range and more sampling points may correspondingly obtain more accurate wave recording files and is more favorable for obtaining more accurate results in S2 and S3.

It is further to be noted that, for the characteristics of long-term running on the line and less maintenance of the fault indicator, an electricity self-taking function is realized in the embodiments of the disclosure, and in case of a line current>5 A, full-function stable running may be implemented by electricity self-taking.

In S2, the wave recording file of each phase line of the three-phase power distribution line is combined and integrated to obtain a fault wave recording file.

In the embodiments of the disclosure, a combining terminal is adopted to combine and integrate the wave recording file of each phase line of the three-phase power distribution line. In consideration of practical data processing consistency, the wave recording file acquired in S1 is a file meeting a requirement of the Comtrade 1999 standard (including a data file and a cfg configuration file). Since the wave recording file records current and voltage waveforms of each phase in the three-phase line, it is necessary to synthesize the recorded current and voltage waveforms to obtain the fault wave recording file. For ensuring that a synthesized zero-sequence current waveform (recorded in the transient wave recording file) may accurately reflect a variation of a transient zero-sequence current when the ground fault occurs, all acquisition units, for example, the wave recording devices, acquiring waveforms of the corresponding phases of lines are required to be kept synchronized, namely simultaneously started to perform wave recording on the corresponding phases of lines. For ensuring that the three acquisition units, for example, the wave recording devices, are simultaneously started for wave recording, in the embodiments of the disclosure, a time difference between a time when each acquisition unit, for example, the three wave recording devices, performs wave recording on the corresponding phase line and a time when the combining terminal combines and integrates the wave recording file is required to be smaller than a preset value. Herein, the preset value adopts a half sampling point time interval, i.e., 1 second÷50 Hz÷80 sampling points÷2=125 microseconds. Of course, other time shorter than the half sampling point time interval may also be adopted.

In S3, the fault wave recording files are synthesized into a transient wave recording file, a position of the ground fault is determined according to a waveform between two points with maximum variation amplitudes in the transient wave recording file, and the position of the ground fault is displayed in a wiring diagram.

In the implementation solution of the disclosure, the fault wave recording files are synthesized into the transient wave recording file. The transient wave recording file records transient zero-sequence current waveforms, the position of the ground fault may be determined according to a principle that transient zero-sequence current waveforms of a faulty line and a non-faulty line are dissimilar, and the position of the ground fault is displayed on an interface of a primary wiring diagram. Of course, fault wave recording files continued to be acquired on the line may also be continued to be received at the same time when the transient wave recording files are synthesized.

It can be understood that the transient zero-sequence current may be acquired only when the three phases of lines simultaneously pass through a mutual inductor. However, in practice, overhead lines are relatively far away from one another, and wires may not directly pass through the mutual inductor for measurement. For this defect, a location process is divided into three steps of acquisition, combining and synthesis in the embodiments of the disclosure. When a fault occurs, wave recording is performed on each phase line to obtain the wave recording file, the corresponding wave recording file is combined and integrated and waveforms before and after the fault in the transient wave recording file synthesized from the fault wave recording files are compared and analyzed to judge and locate the fault, so that single-phase ground fault detection accuracy may be remarkably improved.

The embodiments of the disclosure also provide a computer storage medium, in which a computer-executable instruction is stored, the computer-executable instruction being configured to execute the method for locating a ground fault in the power distribution network.

Herein, the storage medium includes a volatile Random Access Memory (RAM), a Read-Only Memory (ROM), an Electrically Erasable Programmable ROM (EEPROM), a flash memory or another memory technology, a Compact Disc ROM (CD-ROM), a Digital Video Disk (DVD) or another accessed medium.

Figure 2:
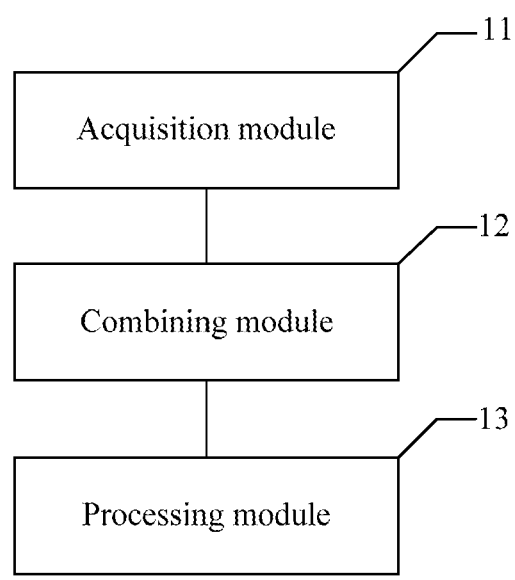
FIG. 2 is a composition structure diagram of a system for locating a ground fault in a power distribution network according to an embodiment of the disclosure.

The embodiments of the disclosure also provide a system for locating a ground fault in a power distribution network, which, referring to FIG. 2, includes an acquisition module 11, a combining module 12 and a processing module 13.

The acquisition module 11 is configured to monitor each phase line of a three-phase power distribution line and, in response to an occurrence of a fault feature waveform, perform wave recording to obtain a wave recording file of the phase line.

In the implementation solution of the disclosure, the acquisition module 11 includes acquisition units, i.e., wave recording devices, correspondingly mounted on the power distribution line with one mounted on each phase line through fixtures to implement real-time monitoring and wave recording of each phase line.

It is to be noted that a transient wave recording type fault indicator arranged on the three-phase power distribution line in advance refers to a device hung on the power distribution line for a long time, designed maintenance-free service life is more than 5 years, and provided electricity self-taking coils are also limited, so that it is necessary to set an index capable of accurately locating a fault on the premise of considering both of power consumption and performance. After a lot of test and optimization work, a wave recording range adopted in the embodiments of the disclosure at least includes waveforms in the range of M periods before to N periods after a fault point, both of M and N being positive integers. Preferably, the wave recording range is from M=3 full-period waves before the fault point to N=5 full-period waves after the fault point, and there are 80 sampling points for each full-period wave. Of course, another wave recording range and sampling points may be selected. Selecting a larger wave recording range and more sampling points may correspondingly obtain more accurate wave recording files and is more favorable for the combining module 12 and the processing module 13 to more accurate processing results.

It is further to be noted that, for the characteristics of long-term running on the line and less maintenance of the fault indicator, the acquisition module 11 in the embodiments of the disclosure has an electricity self-taking function, and in case of a line current>5 A, full-function stable running may be implemented by electricity self-taking.

The combining module 12 is configured to combine and integrate the wave recording file of each phase line of the three-phase power distribution line to obtain a fault wave recording file.

In the embodiments of the disclosure, in consideration of practical data processing consistency, the wave recording file acquired by the acquisition module 11 is a file meeting a requirement of the Comtrade 1999 standard (including a data file and a cfg configuration file). Since the wave recording file records current and voltage waveforms of each phase in the three-phase line, the combining module 12 is required to synthesize the recorded current and voltage waveforms to obtain the fault wave recording file. For ensuring that a synthesized zero-sequence current waveform (recorded in the transient wave recording file) may accurately reflect a variation of a transient zero-sequence current when the ground fault occurs, all acquisition units acquiring waveforms of the corresponding phases of lines are required to be kept synchronized, namely simultaneously started to perform wave recording on the corresponding phases of lines. For ensuring that the three acquisition units are simultaneously started for wave recording, in the embodiments of the disclosure, a time difference between a time when each acquisition unit in the acquisition module 11 performs wave recording on the phase line and a time when the combining module 12 combines and integrates the wave recording file is required to be smaller than a preset value. Herein, the preset value adopts a half sampling point time interval, i.e., 1 second÷50 Hz÷80 sampling points÷2=125 microseconds. Of course, other time shorter than the half sampling point time interval may also be adopted.

In consideration of a delay condition during practical use, the combining module 12 is usually mounted on an electric pole in the vicinity of the acquisition module 11, and time synchronization is performed in a micro-power wireless communication manner, thereby avoiding influence on synthesis results of the corresponding fault wave recording files. In addition, the combining module 12 transmits the fault wave recording files to the processing module 13 through an operating company network such as General Packet Radio Service (GPRS).

The processing module 13 is configured to synthesize the fault wave recording files into a transient wave recording file, determine a position of the ground fault according to a waveform between two points with maximum variation amplitudes in the transient wave recording file and display the position of the ground fault in a wiring diagram.

In the implementation solution of the disclosure, the processing module 13 synthesizes the fault wave recording files into transient zero-sequence current waveforms, determines the position of the ground fault according to a principle that transient zero-sequence current waveforms of a faulty line and a non-faulty line are dissimilar and displays the position of the ground fault on an interface of a primary wiring diagram. Of course, the processing module 13 may also continue receiving other fault wave recording files uploaded by the combining module 12 on the line at the same time of synthesizing the transient wave recording files.

It is to be noted that, during practical use, a function of the processing module 13 is usually realized by a background master station. Because the background master station may have been constructed and is relatively unlikely to reconstruct and the fault wave recording files may not be synthesized into the transient zero-sequence current waveforms, synthesis of the fault wave recording files into the transient zero-sequence current waveforms may be implemented by the combining module 12. In such case, a battery is required to be arranged for the combining module 12, transmission is correspondingly performed through the operating company network such as the GPRS, as described above, and traffic increases by about ⅙.

During practical application, all of the acquisition module 11, the combining module 12 and the processing module 13 may be implemented by a Central Processing Unit (CPU), or a Digital Signal Processor (DSP), or a Micro Processor Unit (MPU), or a Field Programmable Gate Array (FPGA) or the like.

It can be understood that the transient zero-sequence current may be acquired only when the three phases of lines simultaneously pass through a mutual inductor. However, in practice, overhead lines are relatively far away from one another, and wires may not directly pass through the mutual inductor for measurement. For this defect, a location process is divided into three steps of acquisition, combining and synthesis in the embodiments of the disclosure. When a fault occurs, wave recording is performed on each phase line to obtain the wave recording file, the corresponding wave recording file is combined and integrated and waveforms before and after the fault in the transient wave recording file synthesized from the fault wave recording files are compared and analyzed to judge and locate the fault, so that single-phase ground fault detection accuracy may be remarkably improved.

It is finally to be noted that, in the disclosure, a relationship term such as first and second is adopted only to distinguish an entity or operation from another entity or operation and does not always require or imply existence of any practical relationship or sequence between these entities or operations. Moreover, terms "include" and "contain" or any other variant thereof is intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The method and system for locating a ground fault in a power distribution network and the computer storage medium provided in the disclosure are introduced above in detail, the principle and implementation modes of the disclosure are elaborated with specific examples in the disclosure, and the descriptions made to the embodiments are only adopted to help the method of the disclosure and the core concept thereof to be understood. In addition, those of ordinary skill in the art may make variations to the specific implementation modes and the application scope according to the concept of the disclosure. From the above, the contents of the specification should not be understood as limits to the disclosure.

Those skilled in the art should know that the embodiment of the disclosure may be provided as a method, a system or a computer program product. Therefore, the disclosure may adopt a form of hardware embodiment, software embodiment or combined software and hardware embodiment. Moreover, the disclosure may adopt a form of computer program product implemented on one or more computer-available storage media (including, but not limited to, a disk memory and an optical memory) including computer-available program codes.

The disclosure is described with reference to flowcharts and/or block diagrams of the method, device (system) and computer program product according to the embodiments of the disclosure. It is to be understood that each flow and/or block in the flowcharts and/or the block diagrams and combinations of the flows and/or blocks in the flowcharts and/or the block diagrams may be implemented by computer program instructions. These computer program instructions may be provided for a universal computer, a dedicated computer, an embedded processor or a processor of another programmable data processing device to generate a machine, so that a device for realizing a function specified in one flow or multiple flows in the flowcharts and/or one block or multiple blocks in the block diagrams is generated by the instructions executed through the computer or the processor of the other programmable data processing device.

These computer program instructions may also be stored in a computer-readable memory capable of guiding the computer or the other programmable data processing device to work in a specific manner, so that a product including an instruction device may be generated by the instructions stored in the computer-readable memory, the instruction device realizing the function specified in one flow or multiple flows in the flowcharts and/or one block or multiple blocks in the block diagrams.

These computer program instructions may further be loaded onto the computer or the other programmable data processing device, so that a series of operating steps are executed on the computer or the other programmable data processing device to generate processing implemented by the computer, and steps for realizing the function specified in one flow or multiple flows in the flowcharts and/or one block or multiple blocks in the block diagrams are provided by the instructions executed on the computer or the other programmable data processing device.

The above is only the preferred embodiment of the disclosure and not intended to limit the scope of protection of the disclosure.

INDUSTRIAL APPLICABILITY

The location process is divided into the three steps of acquisition, combining and synthesis in the embodiments of the disclosure. When the fault occurs, wave recording is performed on each phase line to obtain the wave recording file, the wave recording file is combined and integrated to obtain the fault wave recording file and the waveforms before and after the fault in the transient wave recording file synthesized from the fault wave recording files are compared and analyzed to judge and locate the fault, so that the single-phase ground fault detection accuracy may be remarkably improved.

The invention claimed is:

1. A method for locating a ground fault in a power distribution network, the method comprising:

monitoring each phase line of a three-phase power distribution line, and in response to an occurrence of a fault feature waveform, performing wave recording to obtain a wave recording file of the phase line;

combining and integrating the wave recording file of each phase line of the three-phase power distribution line to obtain a fault wave recording file; and synthesizing the fault wave recording files into a transient wave recording file, determining a position of the ground fault according to a waveform between two points with maximum variation amplitudes in the transient wave recording file, and displaying the position of the ground fault in a wiring diagram, wherein an acquisition portion configured for each phase line of the three-phase power distribution line is used to perform wave recording on the phase line, and a time difference between a time when each acquisition portion performs wave recording on the phase line and a time when the wave recording files are combined and integrated is smaller than a preset value.

2. The method for locating a ground fault in a power distribution network according to claim 1, wherein the wave recording file at least comprises waveforms in M periods prior to and N periods following a fault point, both of M and N being positive integers.

3. The method for locating a ground fault in a power distribution network according to claim 2, wherein M=3 and N=5.

4. A system for locating a ground fault in a power distribution network, the system comprising:

an acquirer;

a processor; and memory for storing instructions executable by the processor, wherein the acquirer is configured to monitor each phase line of a three-phase power distribution line and, in response to an occurrence of a fault feature waveform, perform wave recording to obtain a wave recording file of the phase line; and wherein the processor is configured to:

combine and integrate the wave recording file of each phase line of the three-phase power distribution line to obtain a fault wave recording file; and synthesize the fault wave recording files into a transient wave recording file, determine a position of the ground fault according to a waveform between two points with maximum variation amplitudes in the transient wave recording file and enable the position of the ground fault to be displayed in a wiring diagram, wherein the acquirer is configured to perform, through acquisition portions configured for respective phase lines, wave recording on the respective phase lines, and a time difference between a time when each acquisition portion performs wave recording on the phase line and a time when the wave recording files are combined and integrated is smaller than a preset value.

5. The system for locating a ground fault in a power distribution network according to claim 4, wherein the acquirer comprises the acquisition portions arranged on respective phase lines of the three-phase power distribution line.

6. The system for locating a ground fault in a power distribution network according to claim 4, wherein the acquirer records waveforms in M periods prior to and N periods following a fault point in the wave recording file, both of M and N being positive integers.

7. The system for locating a ground fault in a power distribution network according to claim 6, wherein M=3 and N=5.

8. A non-transitory computer storage medium having stored thereon computer-executable instructions configured to execute a method for locating a ground fault in a power distribution network, the method comprising:

monitoring each phase line of a three-phase power distribution line, and in response to an occurrence of a fault feature waveform, performing wave recording to obtain a wave recording file of the phase line;

combining and integrating the wave recording file of each phase line of the three-phase power distribution line to obtain a fault wave recording file; and synthesizing the fault wave recording files into a transient wave recording file, determining a position of the ground fault according to a waveform between two points with maximum variation amplitudes in the transient wave recording file, and displaying the position of the ground fault in a wiring diagram, wherein an acquisition portion configured for each phase line of the three-phase power distribution line is used to perform wave recording on the phase line, and a time difference between a time when each acquisition portion performs wave recording on the phase line and a time when the wave recording files are combined and integrated is smaller than a preset value.

9. The non-transitory computer storage medium according to claim 8, wherein the wave recording file at least comprises waveforms in M periods prior to and N periods following a fault point, both of M and N being positive integers.

10. The non-transitory computer storage medium according to claim 9, wherein M=3 and N=5.

* * * * *